(12) United States Patent
Kurita et al.

(10) Patent No.: US 6,344,308 B1
(45) Date of Patent: Feb. 5, 2002

(54) METHOD OF MANUFACTURING A FLEXIBLE CIRCUIT BOARD

(75) Inventors: Hideyuki Kurita; Satoshi Takahashi; Akira Tsutsumi, all of Kanuma (JP)

(73) Assignee: Sony Chemicals Corp., Tokyo (JP)

( * ) Notice: Subject to any disclaimer, the term of this patent is extended or adjusted under 35 U.S.C. 154(b) by 0 days.

(21) Appl. No.: 09/440,167

(22) Filed: Nov. 15, 1999

(30) Foreign Application Priority Data

Nov. 20, 1998 (JP) .......................................... 10-331559

(51) Int. Cl.⁷ ................................................ G03C 5/00
(52) U.S. Cl. ...................... 430/317; 430/313; 430/318; 430/330; 216/17
(58) Field of Search ................................ 430/311–330; 216/17–18

(56) References Cited

U.S. PATENT DOCUMENTS

| | | | | |
|---|---|---|---|---|
| 5,217,849 A | * | 6/1993 | Chonan et al. | 430/313 |
| 5,595,858 A | * | 1/1997 | Akama et al. | 430/313 |
| 6,013,419 A | * | 1/2000 | Tani et al. | 430/330 |
| 6,117,616 A | * | 9/2000 | Omote et al. | 430/311 |

FOREIGN PATENT DOCUMENTS

| | | |
|---|---|---|
| EP | 0 533 198 A2 | 3/1993 |
| JP | A-60-157286 | 8/1985 |
| JP | A-60-243120 | 12/1985 |
| JP | A-63-239998 | 10/1988 |
| JP | A-1-245586 | 9/1989 |
| JP | A-3-123093 | 5/1991 |
| JP | A-5-139027 | 6/1993 |

OTHER PUBLICATIONS

IBM Technical disclosure Bulletin, Planarizing Metal Insulator Structures, Jan. 1983, vol. 25, ISS. No. 8, p. 4141.*

* cited by examiner

Primary Examiner—Mark F. Huff
Assistant Examiner—Daborah Chacko-Davis
(74) Attorney, Agent, or Firm—Oliff & Berridge, PLC

(57) ABSTRACT

A flexible circuit board comprises a polyimide insulating layer 5 with land access holes 3 and a conductor circuit layer 4 provided thereon, and is produced by coating one surface of a conductor circuit metal foil 1 side with a polyimide precursor varnish, which is dried to give a polyimide precursor layer 2, where the polyimide precursor layer 2 is provided with land access holes 3 by a photolithography process; the conductor circuit metal foil 1 is patterned by the subtractive process to form conductor circuit layer 4; and the polyimide precursor layer 4 is then imidated to form polyimide insulating layer 5.

6 Claims, 2 Drawing Sheets

METHOD OF MANUFACTURING A FLEXIBLE CIRCUIT BOARD

BACKGROUND OF THE INVENTION

1. Field of the Invention

The present invention relates to a method of manufacturing a flexible circuit board comprising a conductor circuit layer and a polyimide insulating layer having land access holes provided on one or both sides of the conductor circuit layer.

2. Related Art of the Invention

Flexible circuit boards can be broadly classified as single-sided flexible circuit boards and double-sided flexible circuit boards, the latter affording higher mounting densities.

Typically, the design of a single-sided flexible circuit board comprises an insulating layer having land access holes, and a conductor circuit layer supported thereon. Optionally, a protective layer is laminated over the conductor circuits. Circuit boards of this design are termed "single-access circuit boards" since connections are secured from the one side.

Flexible circuit boards of this type are typically fabricated in the following manner. A single-sided copper clad film produced by laminating copper foil to a polyimide support film is subjected to patterning of the copper foil thereof to produce a conductor circuit layer, and a cover layer is then laminated over the conductor circuit layer. Lamination of the cover layer is accomplished by 1) laminating a cover layer film provided in advance with land access holes by means of a punching cutter, etc., and having an adhesive applied thereto; 2) printing a land access hole pattern with an epoxy resist ink; or 3) after laminating the polyimide resin film, forming land access holes in the polyimide resin film by means of an etchant or irradiation with a laser beam.

Double-sided flexible circuit boards, on the other hand, have a design comprising an upper conductor circuit layer/insulating layer/lower conductor circuit layer laminate sandwiched between a pair of cover layers provided with land access holes. Circuit boards of this design are termed "double-access circuit boards" since connections are secured from both sides.

Double-sided flexible circuit boards of this type are typically fabricated in the following manner. A double-sided copper clad film having copper foil laminated to both sides of a polyimide film is drilled through with an NC drill to produce holes; the surfaces are covered with a resist film, except for the land areas; an electroless copper deposition film is formed on the hole walls; and the copper film is then thickened through electrolytic copper plating to complete the through-holes. Next, after removing the resist film, the copper foil on each side is patterned by the subtractive process (while protecting the walls of the through-holes) to produce the upper conductor circuit layer and lower conductor circuit layer. Cover layers are then laminated to each of these surfaces in the same manner as with a single-access type single-sided flexible circuit board. This completes the fabrication process for a double-access type double-sided flexible circuit board.

Recently, attempts have been made to use a single-sided flexible circuit board as a double-access circuit board; this is fabricated in the following manner. A polyamic acid varnish is applied to copper foil and dried to give a polyamic acid layer. The polyamic acid layer is patterned by a photolithographic process to produce the land access holes, and the layer is then imidated to produce a polyimide insulating layer. The copper foil is patterned by the subtractive process to produce the conductor circuit layer, and a cover layer is laminated over the conductor circuit layer in the same manner as with a single-access type single-sided flexible circuit board. This completes the fabrication process for a double-access type single-sided flexible circuit board.

Drawbacks of conventional fabrication processes for single-access type single-sided flexible circuit boards include the following: where the cover layer film is provided with preformed land access holes using a punching cutter, patterning of fine lines is difficult, precision of alignment is not satisfactory, and hole shape is limited to a substantially round configuration, limiting the degree of freedom as to shape, and as a result making it difficult to expand the soldering area (land area). Another problem is that when the cover layer film is laminated over the conductor circuit layer, the adhesive is pressed out onto the lands, resulting in less reliable conductivity of the lands. Where lands are particularly small, some lands may become entirely covered by adhesive, with the result that conductivity cannot be assured.

Where lamination of the cover layer is effected by screen printing of a land access hole pattern using an epoxy-based resist ink, it is not possible to produce a film having adequate flexibility due to the presence of an epoxy resin as the principal component. While it would be possible to use a polyimide-based resist ink, high hygroscopicity contributes to poor printability and inadequate controllability of printing thickness. Another problem is that it will be extremely difficult to make finer hole pattern size by using conventional printing techniques.

Where lamination of the cover layer is effected by lamination of a polyimide resin film followed by formation of land access holes in the polyimide resin film by means of wet etching, it will be necessary to use as etchants strongly basic reagents (aqueous alkaline solutions of hydrazines), which are expensive, and the additional costs entailed in etchant disposal will make it difficult to reduce etching costs. Where the land access holes are formed by means of irradiation with a laser beam, productivity tends to be low since holes must be made one by one; further, burned material tends to become deposited on the lands, making necessary treatment with potassium permanganate solution, which contributes to higher production costs.

Problems pertaining to fabrication of double-access type double-sided flexible circuit boards, on the other hand, are, where holes are produced in double-sided copper clad film using an NC drill, the significant equipment costs associated with the NC drilling unit and low productivity due to the fact that holes are made one by one. Other problems are burring at the end surfaces around hole openings and non-uniform hole shape. Another problem is that cuttings adhere to hole walls resulting in less reliable through-hole conductivity. Yet another problem associated with double-sided flexible circuit boards is excessive thickness overall.

Accordingly, attempts have been made to substitute the single-sided flexible circuit boards described previously for double-sided flexible circuit boards for use as double-access type flexible circuit boards; however, since patterning of the copper foil is carried out after imidation of the polyamic acid layer, the problem arises that removal of the copper foil pattern tends to be accompanied by curling of the conductor circuit layer/polyimide film laminate. Also, problems similar to those experienced with the single-access type single-sided flexible circuit boards described earlier occur during cover layer lamination.

SUMMARY OF THE INVENTION

The present invention is intended to solve the problems associated with the prior art, and has as an object manufacture of single-access type or double-access type single-sided flexible circuit boards at low cost with fine line patterning, precise alignment, and reduced curling; as well as to increase the degree of freedom as regards hole shape, making it possible to expand the soldering area (land area), and to enable cover layer films or corresponding insulating layers to be produced over conductor circuits layer without adversely affecting land conductivity.

The inventors perfected the invention, which achieves the objects stated above, upon discovering that i) polyimide precursors such as polyamic acids, used in conjunction with photolithographic processes employing inexpensive alkali etchants, afford low cost, fine line patterning, precise alignment, and a high degree of freedom in patterning; ii) polyimide precursors are capable of withstanding conditions used in copper foil patterning; and iii) accordingly, where a polyimide film produced by imidation of a polyimide precursor is employed as an insulating layer in a single-access type or double-access type single-sided flexible circuit board, the copper foil can be patterned prior to imidation of the polyimide precursor layer, allowing a polyimide insulating layer corresponding to a cover layer film to be produced over a conductor circuit layer without adversely affecting land conductivity.

Specifically, the invention provides a method of manufacturing a flexible circuit board comprising a polyimide insulating layer having land access holes and a conductor circuit layer provided thereon, comprising the steps of:

(a) applying a polyimide precursor varnish to one side of a conductor circuit metal foil and drying to produce a polyimide precursor layer;

(b) forming the land access holes in the polyimide precursor layer by a photolithographic process;

(c) patterning the conductor circuit metal foil by the subtractive process to produce the conductor circuit layer; and (d) imidating the polyimide precursor layer to produce the polyimide insulating layer.

The present invention further provides a method of manufacturing a flexible circuit board comprising a first polyimide insulating layer and a second polyimide insulating layer, each having the land access holes, and a conductor circuit layer sandwiched therebetween, comprising the steps of:

(aa) applying a polyimide precursor varnish to one side of a conductor circuit metal foil and dried to produce a first polyimide precursor layer;

(bb) forming the land access holes in the polyimide precursor layer by a photolithographic process;

(cc) patterning the conductor circuit metal foil by the subtractive process to produce the conductor circuit layer;

(dd) applying a polyimide precursor varnish to the conductor circuit layer and drying to produce a second polyimide precursor layer;

(ee) forming land access holes in the second polyimide precursor layer by a photolithographic process; and (ff) imidating the first polyimide precursor layer and the second polyimide precursor layer to produce the first polyimide insulating layer and the second polyimide insulating layer, respectively.

These and other objects, features and advantages of the present invention are described in or will become apparent from the following detailed description of the invention.

DETAILED EXPLANATION OF THE INVENTION

The method of manufacturing a flexible circuit board of single-access type in accordance with the present invention is described step by step with reference to FIGS. 1A to 1E.

Step (a)

Figure 1A:
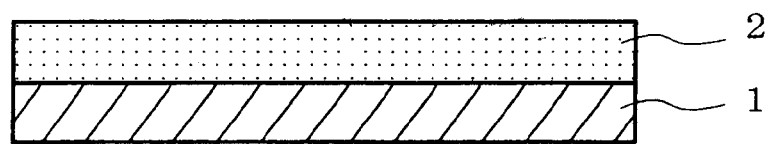
FIGS. 1A to 1E are manufacturing step diagrams for a single-access type flexible circuit board in accordance with the invention.

A polyimide precursor varnish is applied to one surface of a conductor circuit metal foil 1 and dried to give a polyimide precursor layer 2 (FIG. 1A).

Specifically, a polyimide precursor varnish prepared by dissolving a polyimide precursor in N-methyl-2-pyrrolidone, etc., is applied to one surface of the conductor circuit metal foil 1 by means of a comma coater, knife coater, roll coater, lip coater, die coater, or the like, and is then dried by heating so that the residual volatile fraction (solvent, water formed through condensation, etc.) content (percentage by weight (wt %) of total volatile components present in the polyimide precursor layer) is held to 30 to 50 wt % in order to prevent any decline in interlayer adhesive strength or bubbles in subsequent steps, yielding the polyimide precursor layer 2.

The polyimide precursor layer undergoes partial imidation during this drying process; care is taken so that imidation of the polyimide precursor layer 2 does not exceed 50% at the end of the drying process. Fine precise patterning of the polyimide precursor layer at low cost by photolithographic processes employing alkali etchants is difficult where imidation exceeds 50%.

In preferred practice, the polyimide precursor layer 2 may has a thickness of 10 to 75 $\mu$m, since if too thin it will lack mechanical strength, while if too thick the imidated polyimide insulating layer will become stiff, making it difficult to roll the flexible circuit board to the desired roll size.

In preferred practice, in order to prevent curling of the flexible circuit board, the preferred polyimide precursor constituting the polyimide precursor layer 2 is such that the coefficient of linear thermal expansion of the imidated polyimide insulating layer is about equal to the coefficient of linear thermal expansion of the conductor circuit metal foil 1 when annealed under imidation conditions.

Examples of polyimide precursors which may be used include polyamic acids prepared from acid dianhydrides and diamines (see Japanese Patent Application Laid-open No. 60-157286, Japanese Patent Application Laid-open No. 60-243120, Japanese Patent Application Laid-open No. 63-239998, Japanese Patent Application Laid-open No. 1-245586, Japanese Patent Application Laid-open No. 3-123093, and Japanese Patent Application Laid-open No. 5-139027); polyamic acids containing imide rings, prepared from a diisocyanate compound and a dianhydride-terminated polyamic acid prepolymer synthesized from a diamine and an excess of dianhydride (see Polyamide Resin Handbook, Nikkan Kogyo Shinbun Sha (p. 536, 1988); Kobunshi Toronshu, 47(6), 1990); and the like. Polyamic acids prepared from acid dianhydrides and diamines are especially preferred.

Examples of preferred acid dianhydrides are pyromellitic dianhydride (PMDA), 3,4,3',4'-biphenyltetracarboxylic dianhydride (BPDA), 3,4,3',4'-benzophenonetetracarboxylic dianhydride (BTDA), 3,3',4,4'-diphenylsulfonetetracarboxylic dianhydride (DSDA), and the like. Examples of preferred diamines are 4,4'- diaminodiphenyl ether (DPE), p-phenylenediamine (PDA), 4,4'-diaminobenzanilide (DABA), 4,4'-bis(p-aminophenoxy)diphenylsulfone (BAPS), and the like.

The conductor circuit metal foil 1 includes those used in conventional flexible circuit boards. Examples thereof are an electrolytic copper foil, a SUS 304 foil, a SUS 430 foil, an aluminum foil, a beryllium foil, a phosphor bronze foil, and the like.

Typically, the conductor circuit metal foil 1 has a thickness of 8 to 35 $\mu$m.

Step (b)

Figure 1B:
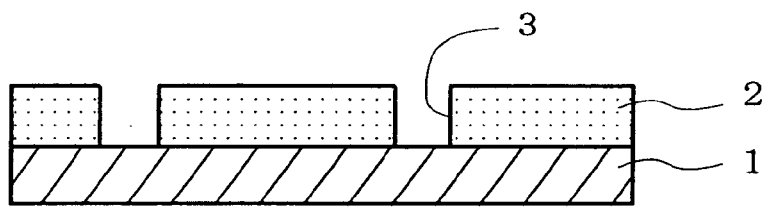

Next, the polyimide precursor layer 2 is provided with land access holes 3 by a photolithographic process capable of fine patterning with precise alignment (FIG. 1B).

Specifically, a land access hole pattern resist layer is formed over the polyimide precursor layer 2, and the polyimide precursor layer 2 is etched with an alkali etchant to produce the land access holes 3. The land access hole pattern resist layer is then removed.

Step (c)

Figure 1C:
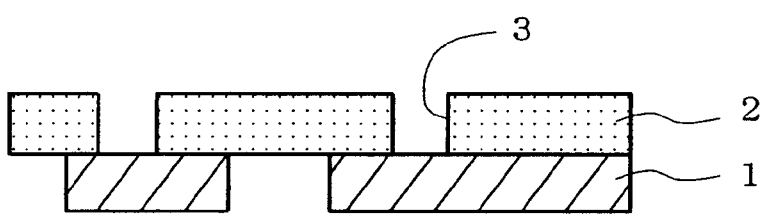

Next, the conductor circuit metal foil 1 is patterned by the subtractive process using a photolithographic technique capable of fine patterning with precise alignment to produce a conductor circuit layer 4 (FIG. 1C). Specifically, the surface of the polyimide precursor layer 2 provided with the land access holes 3 is covered with a protective film (in preferred practice, easy-release low-adhesion tape), the conductor circuit pattern resist layer is formed over the conductor circuit metal foil 1, the conductor circuit metal foil 1 is etched with an etchant (e.g., copper(II) chloride aqueous solution, etc.) to form the conductor circuit layer 4, and the conductor circuit pattern resist layer and protective film are removed.

According to the invention, patterning of the conductor circuit metal foil 1 is performed prior to imidation of the polyimide precursor layer 2 (step (d), described later) for the following reason.

Where patterning of the conductor circuit metal foil 1 is performed after imidation of the polyimide precursor layer 2 (step (d), described later), the conductor circuit/polyimide film laminate tends to curl during removal of the pattern resist layer of the conductor circuit metal foil 1. By patterning the conductor circuit metal foil 1 prior to imidation of the polyimide precursor layer 2, even if thermoplastic polyimide precursor layer 2 should be subjected to stress through patterning of the conductor circuit metal foil 1, during subsequent imidation, the stress will be relaxed during heat treatment for imidation, and the area of the conductor circuit layer 4 contacting polyimide precursor layer 2 will become relatively small, as a result of which the effect of the coefficient of linear thermal expansion will be relatively small. Thus, curling can be prevented or significantly reduced.

Step (d)

Next, the polyimide precursor layer 2 is subjected to imidation to produce a polyimide insulating layer 5. While the structure produced at this stage can be used as a double-access circuit board, in preferred practice completion of the polyimide insulating layer 5 will be followed by formation over the conductor circuit layer of an insulating protective layer 6 of a type known in the art to produce a single-access circuit board (FIG. 1E).

In this way, the a single-access type flexible circuit board can be fabricated at low cost with precisely aligned fine line patterns. There is a high degree of freedom as regards land access hole shape, making it possible to expand the soldering area (land area). As a result, a polyimide insulating layer corresponding to a cover layer film can be produced over a conductor circuit layer without adversely affecting land conductivity.

The method of manufacturing a flexible circuit board of double-access type in accordance with the invention is described step by step with reference to FIGS. 2A to 2F Step (aa)

Figure 2A:
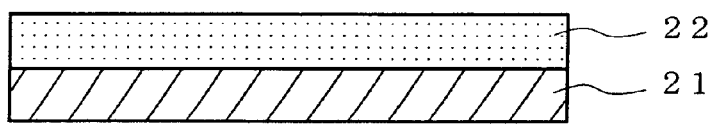
FIGS. 2A to 2F are step diagrams for a double-access type flexible circuit board in accordance with the invention.

Following production step (a) for the single-access type flexible circuit board, depicted in FIG. 1A, a polyimide precursor varnish is applied to one surface of a conductor circuit metal foil 21 and dried to give a first polyimide precursor layer 22 (FIG. 2A).

Step (bb)

Figure 2B:
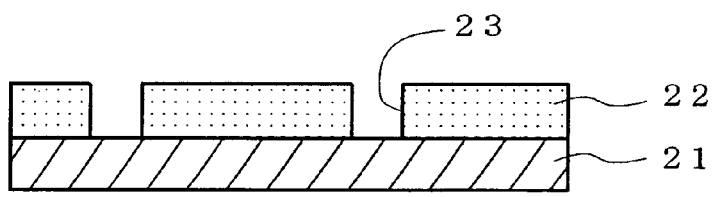

Following production step (b) for the single-access type flexible circuit board, depicted in FIG. 1B, the first polyimide precursor layer 22 is provided with land access holes 23 by a photolithographic process capable of fine patterning with precise alignment (FIG. 2B).

Step (cc)

Figure 2C:
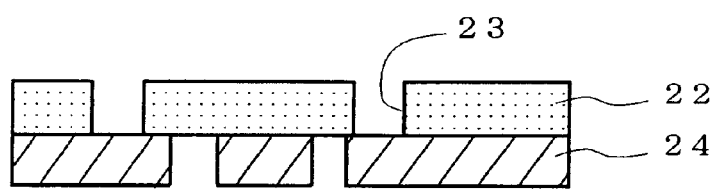

Following production step (c) for the single-access type flexible circuit board, depicted in FIG. 1C, the conductor circuit metal foil is patterned by the subtractive process using a photolithographic technique capable of fine patterning with precise alignment to produce a conductor circuit layer 24 (FIG. 2C).

Step (dd)

Figure 2D:
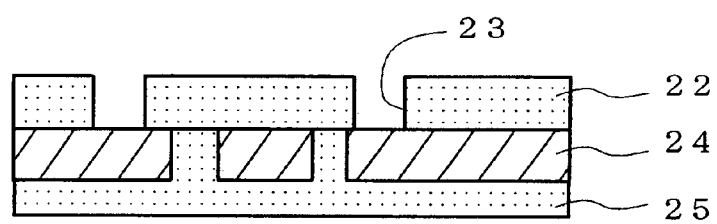

Following production step (a) for the single-access type flexible circuit board, depicted in FIG. 1A, a polyimide precursor varnish is applied to one surface of conductor circuit layer 24 (the side opposite that on which the first polyimide precursor layer 22 is formed) to give a second polyimide precursor layer 25 (FIG. 2D).

In preferred practice, imidation rate will not exceed 50% in the first polyimide precursor layer 22 or the second polyimide precursor layer 25. This allows bonding strength between them to be increased appreciably, enhancing circuit board reliability.

Step (ee)

Figure 2E:
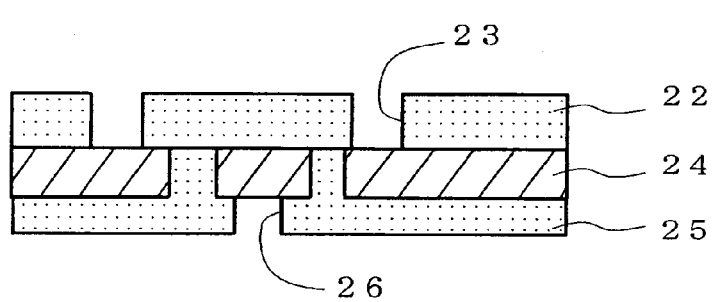

Following production step (b) for the single-access type flexible circuit board, depicted in FIG. 1B, the second polyimide precursor layer 25 is provided with land access holes 26 by a photolithographic process capable of fine patterning with precise alignment (FIG. 2E).

Step (ff)

Figure 1D:
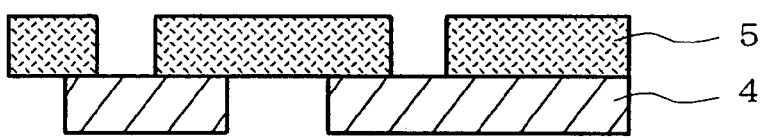
Figure 1E:
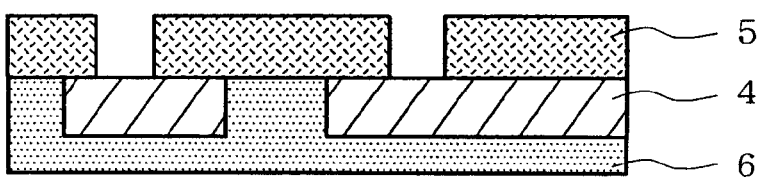
Figure 2F:
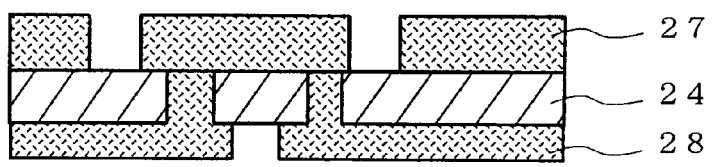

Following production step (d) for the single-access type flexible circuit board, depicted in FIG. 1D, the first polyimide precursor layer 22 and the second polyimide precursor layer 25 are subjected to imidation to produce a first polyimide insulating layer 27 and a second polyimide insulating layer 28, respectively (FIG. 2F).

In this way, a double-access type flexible circuit board can be fabricated at low cost with precisely aligned fine line patterns. There is a high degree of freedom as regards hole shape, making it possible to expand the soldering area (land area). As a result, cover layer films can be laminated over conductor circuit layers without adversely affecting land conductivity. Since the coefficients of linear thermal expansion of the polyimide insulating layers provided on both sides of the conductor circuit layer 24 are substantially equal, curling of the circuit board can be prevented or substantially reduced regardless of the magnitude of the coefficient of linear thermal expansion of the conductor circuit layer 24.

EXAMPLES

The invention is explained in detail below.

Reference Example A1

In a 60-liter reaction vessel equipped with a temperature controller and a jacket, 1.05 kg (11.2 mol)

p-phenylenediamine (PDA, available from Mitsui Kagaku) and 0.86 kg (4.8 mol) 4,4'-diaminodiphenyl ether (DPE, available from Wakayama Seika) were dissolved in about 45 kg N-methyl-pyrrolidone solvent (NMP, available from Mitsubishi Kagaku) under nitrogen gas. At 50° C., 3.523 kg (16.14 mol) pyromellitic dianhydride (PMDA, available from Mitsubishi Gas Kagaku) was added gradually while reacting for 3 hours. This procedure yielded a polyamic acid varnish with a solids content of about 12% and viscosity of 25 Pa·S (25° C.).

The resultant polyamic acid varnish was applied over a copper foil. In a continuous oven, the solvent was evaporated out at 80 to 170° C., and the temperature was then raised to 230 to 350° C., followed by treatment at 350° C. for 30 minutes to bring about imidation. The copper foil was then etched with copper(II) chloride aqueous solution to produce a single layer polyimide film 25 $\mu$m thick. The polyimide film had a coefficient of linear thermal expansion of $22 \times 10^{-6}$/K (measuring device used: Thermal Mechanical Analyzer (TMA/SCC150CU, available from SII (tensioning method: load used 2.5 to 5 g)).

Reference Example A2

The procedure of Reference Example A1 was repeated except for using 5.175 kg (7.2 mol) p-phenylenediamine (PDA, available from Mitsui Kagaku) and 1.577 kg (8.8 mol) 4,4'-diaminodiphenyl ether (DPE, available from Wakayama Seika) to prepare a polyamic acid varnish. A single layer polyimide film produced from the resultant polyamic acid varnish had a coefficient of linear thermal expansion of $31 \times 10^{-6}$/K.

Working Example 1
(Fabrication of single-access type flexible circuit board)

The polyamic acid varnish prepared in Reference Example A1 was applied to a dry thickness of 25 $\mu$m over electrolytic copper foil 18 $\mu$m thick and 540 mm wide (CFT9-LP, available from Fukuda Kinzoku) and dried by heat treatment at 230° C. in a continuous oven to produce a polyimide precursor layer. The polyimide precursor layer had a residual volatile content of 38.5%. Imidation rate was 20.5%, as determined by infrared spectral analysis.

Next, an alkali-resistant photoresist (NR-41, available from Sony Chemicals Corp.) was applied over the polyimide precursor layer so as to give a thickness of 10 $\mu$m after drying out the solvent. This was exposed and developed in a pattern corresponding to the land access hole pattern to produce an etching resist layer, and the polyimide precursor layer was etched with warm water and 10% potassium hydroxide aqueous solution until the copper foil was exposed, forming land access holes of various shape (round, rectangular, etc.). The etching resist layer was then removed by ordinary methods.

The copper foil at the bottoms of the land access holes was examined by optical microscope; no undissolved polyamic acid resin was found to be present.

Next, the surface of the polyimide precursor layer provided with land access holes was covered with easy-release low-adhesion tape (PET8184, available from Sony Chemicals Corp.) as a protective film, a photoresist film (SPG152, available from Asahi Kasei) was laminated to the copper foil surface, and an etching resist pattern corresponding to the conductor circuit pattern was produced using a photolithographic process. The copper foil was patterned with copper (II) chloride etchant to remove the etching resist pattern and form the conductor circuit layer.

Next, the protective film was removed from the polyimide precursor layer surface, and the polyamic acid varnish prepared in Reference Example A1 was applied to the conductor circuit layer so as to give a dry thickness of 25 $\mu$m. The product was heat-treated at 80 to 170° C. in a continuous oven. It was then transferred to a batch oven under a nitrogen gas atmosphere (oxygen concentration $\leq 0.1\%$), heated to 350° C. over a one-hour period, and then held at 350° C. for 15 minutes to bring about imidation, forming a polyimide insulating layer. The product was then brought to 200° C. under a nitrogen gas atmosphere and then cooled in air, yielding a single-access type flexible circuit board. The circuit board exhibited no curling.

The resultant flexible circuit board was subjected to soft etching to remove the oxide film from the land surfaces and then immersed in a solder bath at 300° C. No deformation due to bulging or contraction were noted, and solderability to the lands was good.

When the lands of the flexible circuit board were subjected to electroless tin plating (60° C., 15 min, 1 $\mu$m thickness), a firmly adhering tin plating layer was formed. No penetration of a plating solution into the polyimide insulating layer-conductor circuit layer interface was noted in the vicinity of the lands.

Bonding strength between the polyimide insulating layer and the conductor circuit layer was high enough to present no practical problems.

Working Example 2
(Fabrication of double-access type flexible circuit board)

The polyamic acid varnish prepared in Reference Example A2 was applied to over electrolytic copper foil 18 $\mu$m thick and 540 mm wide (CF-T9-LP, available from Fukuda Kinzoku) so as to give a dry thickness of 25 $\mu$m and dried by heat treatment at 230° C. in a continuous oven to produce a first polyimide precursor layer. The first polyimide precursor layer had a residual volatile content of 34.0%. Imidation rate was 18.5%, as determined by infrared spectral analysis.

Next, an alkali-resistant photoresist (NR-41, available from Sony Chemicals Corp.) was applied over the first polyimide precursor layer so as to give a thickness of 10 $\mu$m after drying out the solvent. This was exposed and developed in a pattern corresponding to the land access hole pattern to produce an etching resist layer, and the first polyimide precursor layer was etched with warm water and 10% potassium hydroxide aqueous solution until the copper foil was exposed, forming land access holes of various shape (round, rectangular, etc.). The etching resist layer was then removed by ordinary methods.

The copper foil at the bottoms of the land access holes in the first polyimide precursor layer was examined by optical microscope; no undissolved polyamic acid resin was found to be present.

Next, the surface of the first polyimide precursor layer provided with land access holes was covered with easy-release low-adhesion tape (PET8184, available from Sony Chemicals Corp.) as a protective film, a photoresist film (SPG152, available from ex Asahi Kasei) was laminated to the copper foil surface, and an etching resist pattern corresponding to the conductor circuit pattern was produced using a photolithography process. The copper foil was patterned with copper(II) chloride etchant to remove the etching resist pattern, thus forming the conductor circuit layer.

Next, the polyamic acid varnish prepared in Reference Example A2 was applied to the conductor circuit layer on the side opposite that on which the first polyimide layer was formed, so as to give a dry thickness of 25 $\mu$m. The product was heat treated at 80 to 170° C. in a continuous oven to produce a second polyimide precursor layer. Imidation rate was 19.0%, as determined by infrared spectral analysis.

Next, an alkali-resistant photoresist (NR-41, available ex Sony Chemicals Corp.) was applied to the second polyimide precursor layer so as to give a thickness of 10 µm after drying out the solvent. This was exposed and developed in a pattern corresponding to the land access hole pattern to produce an etching resist layer, and the second polyimide precursor layer was etched with warm water and 10% potassium hydroxide aqueous solution until the copper foil was exposed, forming land access holes of various shape (round, rectangular, etc.). The etching resist layer was then removed by conventional methods.

The copper foil at the bottoms of the land access holes in the second polyimide precursor layer was examined by optical microscope; no undissolved polyamic acid resin was found to be present.

Next, the protective film was removed from the first polyimide precursor layer surface and the product was charged to a batch oven under a nitrogen gas atmosphere (oxygen concentration $\leq 0.1\%$), heated to 350° C. over a one-hour period, and then held at 350° C. for 15 minutes to bring about imidation, forming a first polyimide insulating layer and a second polyimide insulating layer from the first polyimide precursor layer and the second polyimide precursor layer, respectively. The product was then brought to 200° C. under a nitrogen gas atmosphere and then cooled in air. This process yielded a double-access type single-sided flexible circuit board. The circuit board exhibited no curling.

The resultant flexible circuit board was subjected to soft etching to remove the oxide film from the land surfaces and then immersed in a solder bath at 300° C. No deformation due to bulging or contraction were noted, and solderability to the lands was good.

When the lands of the flexible circuit board were subjected to electroless tin plating (60° C., 15 min, 1 µm thickness), a firmly adhering tin plating layer was formed. No penetration of plating solution intuit the polyimide insulating layer-conductor circuit layer interface was noted in the vicinity of the lands.

Bonding strength between the polyimide insulating layers and conductor circuit layer was high enough to present no practical problems.

According to the manufacturing method of the present invention, there is provided fabrication of single-access type or double-access type flexible circuit boards at low cost with fine line patterning, precise alignment, and reduced curling. Further, there is a greater degree of freedom as regards hole shape, making it possible to expand the soldering area (land area), thus enhancing the reliability of land conduction.

The entire disclosure of the specifications, claims and summaries of Japanese Patent Applications No. 10-331559 filed on Nov. 20, 1998 is herein incorporated by reference.

What is claimed is:

1. A method of manufacturing a flexible circuit board comprising a polyimide insulating layer having land access holes and a conductor circuit layer provided thereon, comprising the steps of:

(a) applying a polyimide precursor varnish to one side of a conductor circuit metal foil and drying to produce a polyimide precursor layer;

(b) forming the land access holes in the polyimide precursor layer by a photolithographic process comprising: forming a land access hole pattern resist layer over the polyimide precursor layer; etching the land access hole pattern resist layer to produce the land access holes; and removing the land access hole pattern resist layer;

(c) subsequent to forming the land access holes, patterning the conductor circuit metal foil by a subtractive process to produce the conductor circuit layer; and (d) imidating the polyimide precursor layer to produce the polyimide insulating layer.

2. The manufacturing method according to claim 1, wherein, after drying in step (a), an imidation rate of the polyimide precursor layer is 50% or less.

3. The method of manufacturing a flexible circuit board according to claim 1, wherein the polyimide precursor varnish comprises a polyamic acid.

4. A method of manufacturing a flexible circuit board comprising a first polyimide insulating layer and a second polyimide insulating layer, each having land access holes, and a conductor circuit layer sandwiched therebetween, comprising the steps of:

(aa) applying a first polyimide precursor varnish to one side of a conductor circuit metal foil and dried to produce a first polyimide precursor layer;

(bb) forming the land access holes in the first polyimide precursor layer by a photolithographic process comprising: forming a land access hole pattern resist layer over the first polyimide precursor layer; etching the land access hole pattern resist layer to produce the land access holes in the first polyimide precursor layer; and removing the land access hole pattern resist layer;

(cc) subsequent to forming the land access holes in the first polyimide precursor layer, patterning the conductor circuit metal foil by a subtractive process to produce the conductor circuit layer;

(dd) applying a second polyimide precursor varnish to the conductor circuit layer and drying to produce a second polyimide precursor layer;

(ee) forming land access holes in the second polyimide precursor layer by a photolithographic process; and (ff) imidating the first polyimide precursor layer and the second polyimide precursor layer to produce the first polyimide insulating layer and the second polyimide insulating layer, respectively.

5. The manufacturing method according to claim 4, wherein, after drying in step (aa) and step (dd), an imidation rate of the first polyimide precursor layer and the second polyimide precursor layer is 50% or less.

6. The method of manufacturing a flexible circuit board according to claim 4, wherein the first polyimide precursor varnish and the second polyimide cursor comprise a polyamic acid.

* * * * *